(12) United States Patent
Kimura et al.

(10) Patent No.: US 7,829,863 B2
(45) Date of Patent: Nov. 9, 2010

(54) ELECTRON BEAM IRRADIATION DEVICE

(75) Inventors: Kenjiro Kimura, Kyoto (JP); Kei Kobayashi, Kyoto (JP); Hirofumi Yamada, Kyoto (JP); Kazumi Matsushige, Kyoto (JP)

(73) Assignee: Kyoto University, Kyoto (JP)

( * ) Notice: Subject to any disclaimer, the term of this patent is extended or adjusted under 35 U.S.C. 154(b) by 306 days.

(21) Appl. No.: 11/920,420

(22) PCT Filed: Nov. 18, 2005

(86) PCT No.: PCT/JP2005/021299

§ 371 (c)(1),
(2), (4) Date: Nov. 15, 2007

(87) PCT Pub. No.: WO2006/123447

PCT Pub. Date: Nov. 23, 2006

(65) Prior Publication Data

US 2009/0127473 A1     May 21, 2009

(30) Foreign Application Priority Data

May 17, 2005   (JP)   ............................. 2005-144049

(51) Int. Cl.
*G21K 1/08* (2006.01)

(52) U.S. Cl. ............................. 250/396 R; 250/396 ML; 250/492.1; 250/492.2; 250/492.22; 250/492.24; 250/492.3

(58) Field of Classification Search ............. 250/396 R, 250/396 ML, 492.1, 492.2, 492.22, 492.24, 250/492.3

See application file for complete search history.

(56) References Cited

U.S. PATENT DOCUMENTS

| 4,634,874 | A | | 1/1987 | Ward |
| 5,029,222 | A | | 7/1991 | Yamada et al. |
| 5,099,128 | A | * | 3/1992 | Stettner ................. 250/370.11 |
| 5,103,101 | A | * | 4/1992 | Berglund et al. ......... 250/492.2 |
| 5,260,151 | A | | 11/1993 | Berger et al. |
| 5,386,221 | A | * | 1/1995 | Allen et al. ................. 347/239 |
| 5,466,904 | A | | 11/1995 | Pfeiffer et al. |
| 6,215,128 | B1 | * | 4/2001 | Mankos et al. ......... 250/492.24 |
| 2005/0116185 | A1 | * | 6/2005 | Mizuno ................. 250/492.22 |

FOREIGN PATENT DOCUMENTS

JP          54-085665 A        7/1979

(Continued)

*Primary Examiner*—Jack I Berman
*Assistant Examiner*—Hanway Chang
(74) *Attorney, Agent, or Firm*—Birch, Stewart, Kolasch & Birch, LLP

(57) ABSTRACT

An electron beam irradiation device of the present invention includes: a projector 8 for generating a two-dimensional light pattern 13; a microchannel plate 11 for (i) generating an electron beam array based on the light pattern 13 having entered, (ii) amplifying the electron beam array, and (iii) emitting the electron beam array as an amplified electron beam array 14; and an electron beam lens section 12 for converging the amplified electron beam array 14. This electron beam irradiation device is capable of manufacturing a semiconductor device whose performance is improved through a finer processing by means of irradiation using an electron beam. Further, the electron beam irradiation device allows cost reduction, because the device allows collective irradiation using a two dimensional pattern.

10 Claims, 15 Drawing Sheets

FOREIGN PATENT DOCUMENTS

| | | |
|---|---|---|
| JP | 55-87432 A | 7/1980 |
| JP | 64-061914 A | 3/1989 |
| JP | 60-92617 A | 4/1994 |
| JP | 06-236840 A | 8/1994 |
| JP | 06-236842 A | 8/1994 |
| JP | 11-097331 A | 4/1999 |
| JP | 2004-304135 A | 10/2004 |

* cited by examiner

FIG. 11 (a)    FIG. 11 (b)
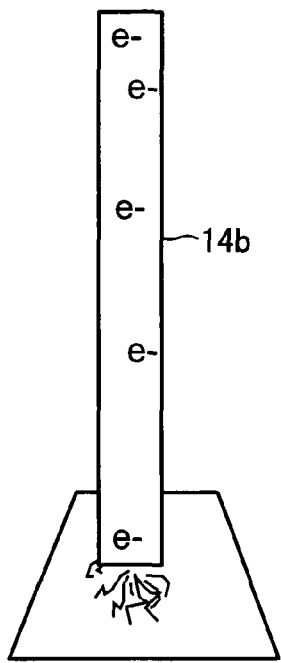
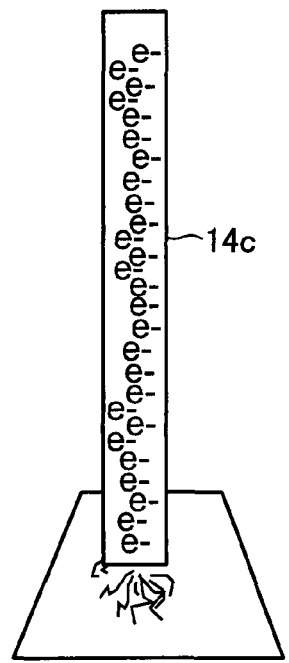
FIG. 12
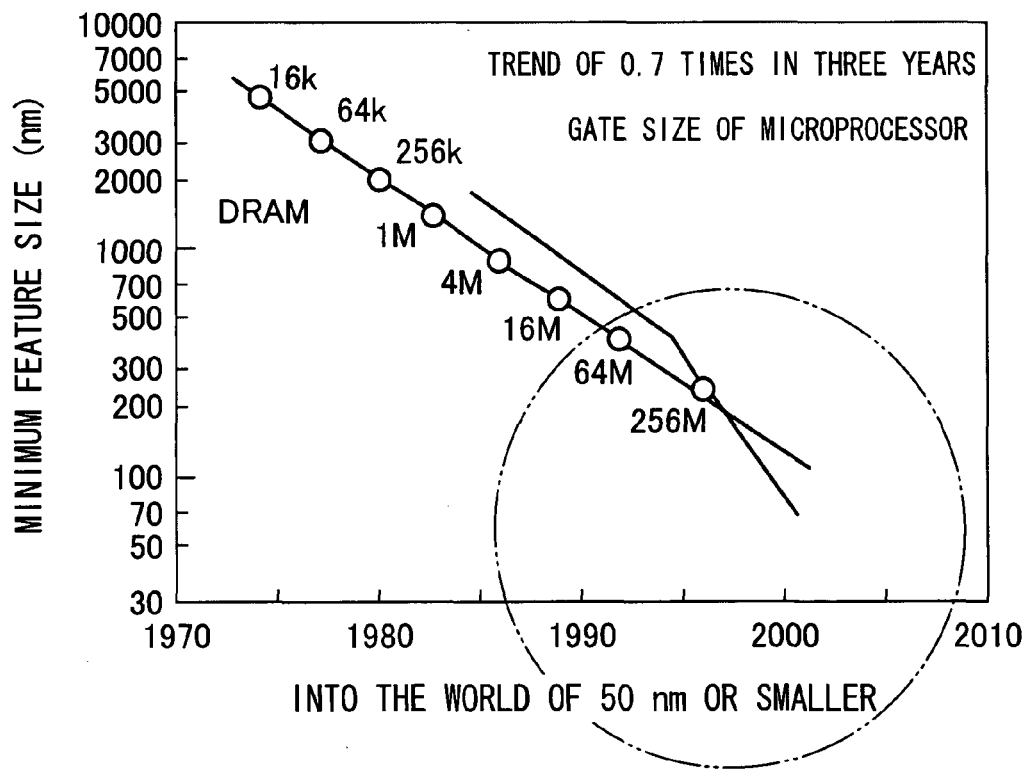

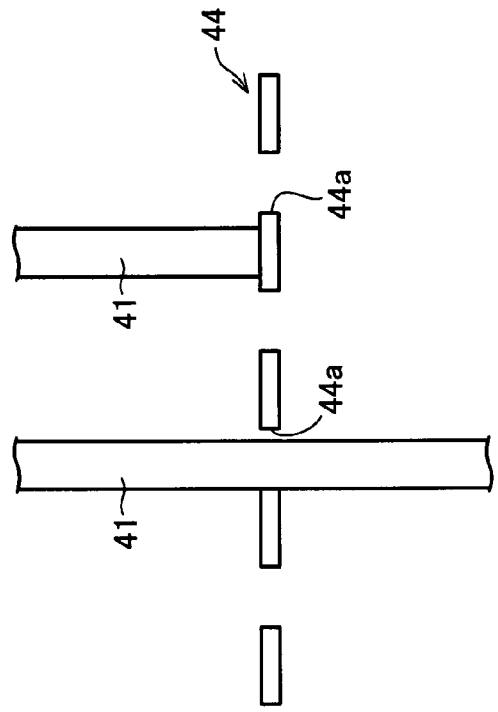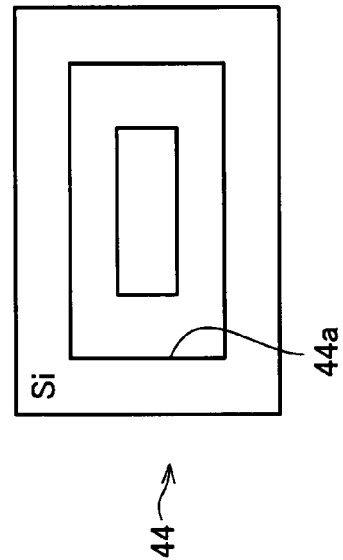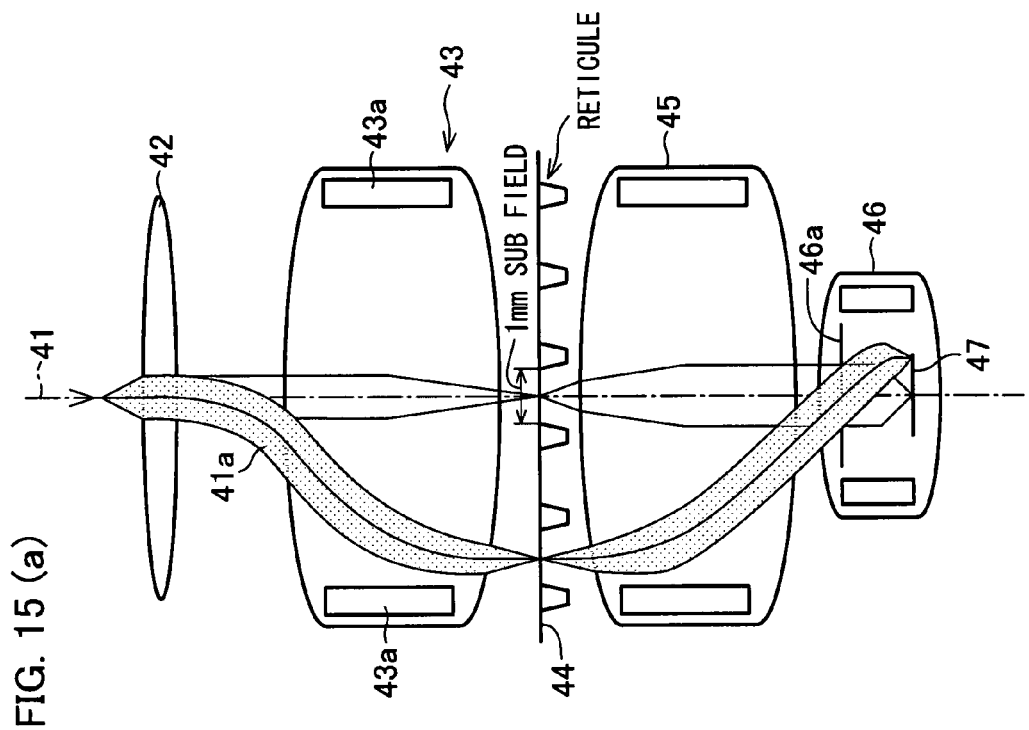

ELECTRON BEAM IRRADIATION DEVICE

TECHNICAL FIELD

The present invention relates to an electron beam irradiation device capable of finely processing a semiconductor device for use in a semiconductor device, in a manufacturing process of semiconductor devices such as LSIs.

BACKGROUND ART

It is possible to say that the performance of a semiconductor device today largely depends on the accuracy of a fine processing (i.e., reducing the minimum feature size in semiconductor integrated system) through a semiconductor lithography technology (See FIG. 12). In a fine processing using a conventional lithography technology with light (electromagnetic wave) of a visible light band, the wavelength of light determines the resolution. Accordingly, as shown in FIG. 13, in order to achieve a finer processing, it is necessary to use light of a shorter wavelength band than a visible light region; e.g. EUV (Extreme Ultraviolet Rays) or X ray.

However, it is not easy to design a device for generating light of such a short wavelength band, or an optical system for focusing the light beam which is patterned by reticle.

For this reason, there has been a suggestion to use an electron beam (electron ray) in a fine processing by a semiconductor lithography technology, on the grounds that an electron beam is relatively easy to generate or control, though it is difficult to tailor diverging lens.

However, a semiconductor manufacturing (lithography) device adopting an already-existing electron beam directly draws a circuit pattern of a semiconductor device with a use of a single electron beam. Accordingly, a large amount of irradiation time (several hours to several tens of hours) is required to draw an entire circuit pattern of a highly-integrated semiconductor device. In other words, a wavelength-dependent electron beam irradiation method for breaking through the limit of the fine processing is one dimensional exposure method for a practical. Therefore, a large amount of exposure time should be reduced and the development of two-dimensional irradiation is required.

In recent years, in order to shorten the irradiation time of electron beam lithography, a two-dimensional irradiation method which collectively forms a two-dimensional electron beam pattern have been developed. Examples of such two-dimensional electron beam collective irradiation methods are called SCALPEL method developed by AT&T and PRIVAIL method developed by IBM.

In the SCALPEL method as shown in FIG. 14(a), an electron beam 31 is projected on a reticle 32 having a dispersing section 32b which have device pattern on the surface of a membrane 32a. Through an optical system having an electronic lens 33 and a back focal plane filter 34, the emitted electron beam is projected on an electron ray resist. Thus, a circuit pattern is formed. This SCALPEL method is also described in Patent Citation 1.

As shown in FIG. 15(a) and FIG. 15(b), in the PRIVAIL method, an Si substrate 44 on which a hole 44a is formed according to the pattern is used as a reticle. Toward this patterned Si substrate 44, an electron beam 41 is projected. Through an optical system, the electron beam 41 having passed the hole 44a is projected to an electron ray resist, thereby exposing the wafer to the beam. Examples of the optical system in PRIVAIL method are: an electronic lens 42; an illumination lens 43 having a yoke for polarizing an axis of the electron beam; a collimation lens 45; and a projection lens 46 having a contrast aperture 46. Note however that the PRIVAIL method is not able to manufacture an Si substrate 44 having a hollow portion as shown n FIG. 15(c). Patent Citation 2 describes the PRIVAIL method.

(Patent Citation 1) U.S. Pat. No. 5,260,151 (Date of Patent: Nov. 9, 1993)

(Patent Citation 2) U.S. Pat. No. 5,466,904 (Date of Patent: Nov. 14, 1995)

DISCLOSURE OF INVENTION

Technical Problem

As shown in FIG. 14(b), in the SCALPEL method, the electron beam 31 needs to pass the membrane 32a. Therefore, the resolution in that portion is significantly deteriorated.

On the other hand, the PRIVAIL method has the following problem. When forming a complicated pattern (e.g. when forming a pattern as shown in FIG. 15(c) having a hollow part), we can not suspend the central Si substrate, and in order to fabricate the pattern shown in FIG. 15(c), we have to divide its pattern to two patterns without hollows which can not be suspended from anywhere. Moreover, we have to adjust the positions of two patterns with nanometer resolution. Due to the accuracy of the adjustment, the resolution is significantly limited at about 100 nm in the case of SCALPEL method.

Both methods require troublesome operations such as manufacturing of reticule or adjusting the multiple masks positioning in vacuum. As above-described, the both methods have some fundamental problems.

The present invention is aimed at providing an electron beam irradiation device capable of forming a highly accurate lithography pattern, using an electron beam. It is further an object of the present invention to provide an electron beam irradiation device capable of promptly forming a desirable two-dimensional lithography pattern at a low cost, by a two-dimensional collective irradiation.

Technical Solution

In order to achieve the foregoing object, an electron beam irradiation device of the present invention includes: a light pattern generating section for generating a two-dimensional light pattern; an electron amplification section for (i) generating an electron beam array based on the light pattern introduced, (ii) amplifying the electron beam array, and (iii) emitting the electron beam array as an amplified electron beam array; and an electron beam lens section for converging the amplified electron beam array toward an electron ray resist.

In the electron beam irradiation device, above-mentioned electron beam lens section is preferably capable of performing at least one of (i) acceleration of the amplified electron beam array, (ii) alignment of the amplified electron beam array, and (iii) projection of the amplified electron beam array.

In the above-mentioned system, the amplified electron beam array generated by the two-dimensional light pattern is projected toward the electron ray resist on the substrate having a metal thin film. Thus, it is possible to form a two-dimensional patterned electron beam array, and shorten the time of processing of electron beam irradiation. Furthermore, the system adopts the amplified electron beam array generated from a two-dimensional light pattern. Therefore, the intensity of the electron beam projected on the electron ray resist is enough increased. As a result, the time of electron beam irradiation is further reduced, and the lithography speed is improved.

Accordingly, the system can improve the accuracy of the lithography pattern because of the use of short electron wave and the speed of forming the lithography pattern. Therefore, for example, fine processing of a semiconductor device with the minimum feature size of 5 nm or smaller is accurately and quickly performed. This allows manufacturing of a LSI having a highly integrated semiconductor device of 5 nm scale or smaller, at a low cost.

Furthermore, when the electron beam lens section is capable of accelerating the amplified electron beam array, it is possible to shorten the wavelengths of the electron rays. In this case, it is possible to fabricate a more miniaturized lithography pattern, and improve the accuracy of the lithography pattern and the lithography speed. In addition, when the electron beam lens section is capable of aligning the amplified electron beam array, it is possible to further improve the accuracy of the lithography pattern.

In the electron beam irradiation device, above-mentioned electron amplification section includes multiple cylindrical microchannels which are preferably arranged to be adjacent to one another in a direction perpendicularly crossing a direction of a light axis of the light pattern so that respective axes of the microchannels are parallel to the direction of the light axis.

With the system having the microchannels, it is possible to more accurately form the amplified electron beam array which is a collection of micro electron beams obtained by dividing the light pattern having been projected.

As a result, the system more surely yields the amplified electron beam array. Therefore, the speed of forming the lithography pattern can be improved. With this, for example, it is possible to more accurately, more finely, and promptly fabricate a semiconductor device, with the miniaturized feature size of 5 nm or smaller. This allows manufacturing of a LSI having a highly integrated semiconductor device of 5 nm scale or smaller, at a low cost.

In the electron beam irradiation device, said electron amplification section preferably includes a photoelectric film for converting photons of a lithographic pattern into electrons and for emitting the electrons.

In the system, the photoelectric section is provided on a light pattern entering side at the electron amplification section. Therefore, even if the light intensity of the light pattern from the light pattern generating section is low, an electron pattern according to the light pattern is amplified in the electron amplification section, and the amplified electron beam array is more surely obtained.

In the electron beam irradiation device, said light pattern generating section preferably includes: a femto-second laser; and a micro-mirror array section for reflecting a laser beam from the femto-second laser, thereby forming the two-dimensional light pattern.

In the system, the laser beam from the femto-second laser is turned into a two dimensional pattern by the micro-mirror array section. Then, when the light pattern is projected on the electron amplification section, the electron beam array according to the light pattern is generated in the electron amplification section.

Therefore, the system allows formation of a semiconductor device through a highly accurate and prompt lithography, as in the case where the photoelectric film is used. Moreover, since the photoelectric film can be omitted in the system utilizing the femto-second laser, the vacuum state required for avoiding oxidation of a photoelectric film does not have to be maintained. Therefore, it is possible to restrain an increase in the size of the device and an increase in the cost.

In the electron beam irradiation device, said light pattern generating section preferably includes a compensating section.

The system is provided with the compensating section for compensating the distortion in the electron beam array. Therefore, by performing, on the light pattern side, the compensation of the projected pattern of the amplified electron beam array, it is possible to surely and promptly make the lithography pattern close to the desirable architected pattern.

In the electron beam irradiation device, above-mentioned compensating section preferably includes a section generating reversely-distorted light pattern which in capable of controlling the light pattern in order to compensate distortion that occurs in the amplified electron beam array.

The system is provided with the section generating reversely-distorted light pattern for generating the reverse-distortion light pattern in order to compensate distortion that occurs in the amplified electron beam array. Therefore, the accuracy of the lithography pattern is improved by the cancellation of the distortion.

In the electron beam irradiation device, above-mentioned compensating section preferably includes a section generating divided light pattern which can generate multiple divided light patterns whose all patterns interpolate one another and form the desirable architected device pattern.

Therefore, multiple divided and patterned electron beam arrays compensating one another are obtained from the divided light patterns. By projecting, on a specific area for an architected device on electron ray resist, the divided patterned electron beam arrays at different time along a time axis, it is possible to form the lithography pattern corresponding to the light pattern on the electron ray resist.

At this point, it is possible to increase the distance between adjacent electron beams in each divided patterned electron beam array. Therefore, it is possible to reduce electrostatic interactions between adjacent electron beams in each divided patterned electron beam arrays, and between electrons dispersed inside the electron ray resist.

As a result, with the system, an irradiated pattern with less distortion, corresponding to a desirable architected lithography pattern, can be obtained on the electron ray resist. It is possible to improve the accuracy of the irradiated pattern formed by the divided patterned electron beam array.

It is preferable that the electron beam irradiation device includes: a grid electrostatic lens section 16 provided on an emitting side of the electron amplification section, for restraining divergence of emission angle of the amplified electron beam array from the electron amplification section.

In the system, the amplified electron beam array passes the grid electrostatic lens section. Therefore, it is possible to restrain the divergence of the emission angle and make the beams of the amplified electron beam array parallel to one another, thereby reducing deterioration of the resolution due to the divergence. Furthermore, since the divergence of the emission angle is restrained, the projected pattern is made closely resemble to the desirable architected pattern. Thus, the accuracy in the lithography pattern is improved.

In the electron beam irradiation device, each above-mentioned microchannels preferably have such a shape that its inner surface at an edge portion, on an emission side of the amplified electron beam array, is gradually spread outwardly towards an emission end of the microchannel, for a purpose of restraining divergence of emission angle of the amplified electron beam array from the electron amplification section.

In the system adopting the outwardly-spread shape, each micro electron beam of the amplified electron beam array is directed in order to be substantially parallel to the central axis of the corresponding microchannel, as is the case of adopting the grid electrostatic lens section.

Since the divergence of the emission angle is restrained, it is possible to reduce deterioration of the resolution caused by the divergence. Furthermore, it is possible to improve the resemblance of the formed pattern compensating to the desired pattern. Thus, the accuracy of the lithography pattern can be improved.

ADVANTAGEOUS EFFECTS

As mentioned above, an electron beam irradiation device of the present invention includes: a light pattern generating section for generating a two-dimensional light pattern; an electron amplification section for (i) generating an electron beam array from the light pattern entered, (ii) amplifying the electron beam array, and (iii) emitting the electron beam array as an amplified electron beam array; and an electron beam lens section for converging the amplified electron beam array toward an electron ray resist.

Accordingly, with the system, it is possible to perform highly-accurate, programmable, and high-resolutional lithography by projecting the patterned amplified electron beam array. As a result, as mentioned above, it is possible to, for example, perform finer processing with the more miniaturized feature size of about 5 nm or smaller. Thus, it is possible to manufacture a LSI having a semiconductor device of 5 nm scale or smaller.

BRIEF DESCRIPTION OF DRAWINGS

FIG. 11(a) is a front view schematically showing an amplified electron beam of the present invention.

FIG. 11(b) is a front view schematically showing a conventional electron beam.

FIG. 12 is a graph showing a time-based transition of a general decrease in the minimum feature size of semiconductor devices such as DRAMs and micro processors.

FIG. 15(a) is a cross-sectional view showing another exemplary irradiation process by means of a conventional electron beam.

FIG. 15(b) is an enlarged cross-sectional view showing a main part of the other exemplary irradiation shown in FIG. 15(a) using the conventional electron beam.

FIG. 15(c) is a front view of showing an example of a closed-loop-type hole in an Si substrate serving as a reticule, which is impossible to form by any of the other examples.

BEST MODE FOR CARRYING OUT THE INVENTION

Embodiment 1

Figure 1:
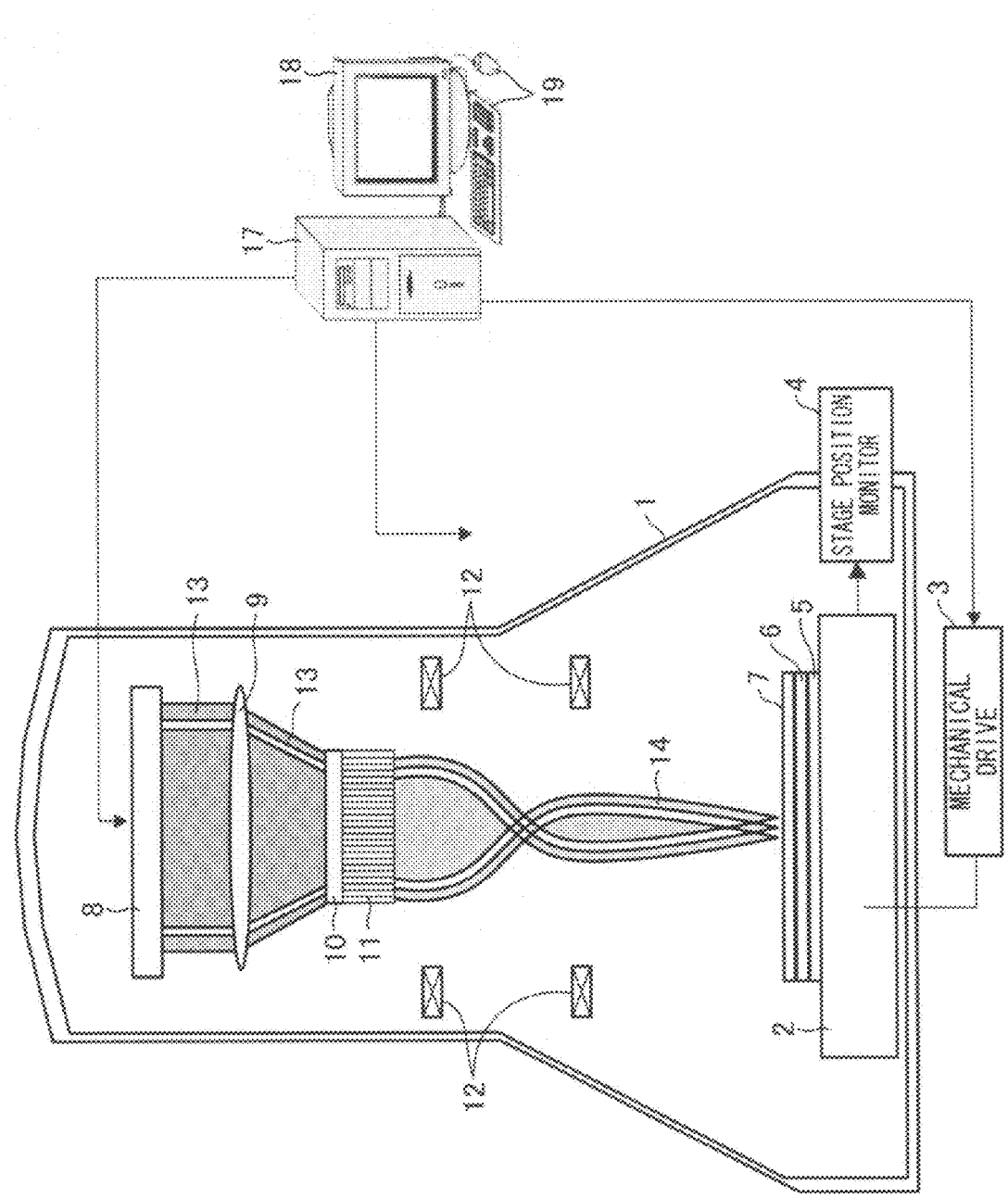
FIG. 1 is a cross sectional view schematically showing main part of an electron beam irradiation device of Embodiment 1, according to the present invention.

The following describes an embodiment of an electron beam irradiation device and a semiconductor manufacturing device, according to the present invention, with reference to FIG. 1 through FIG. 11. As shown in FIG. 1, the semiconductor manufacturing device having the electron beam irradiation device has a box-like vacuum chamber 1. The vacuum chamber 1 is capable of maintaining vacuum state therein, and is provided in such a manner that a degree of vacuum in the vacuum chamber 1 is not more than $10^{-6}$ Torr. In the present embodiment, the degree of vacuum is set at $10^{-8}$ Torr.

In a bottom portion of the vacuum chamber 1, a stage 2 for placing thereon a substrate 5 to be subject to an irradiation is mounted in such a manner that the stage 5 is moveable in horizontal directions. Inside or outside the vacuum chamber 1, a mechanical drive 3 for driving and moving the stage 2 is provided in such a manner that a later-mentioned controller 17 is able to control the mechanical drive 3. Further, a stage position monitor 44 for monitoring the position of the stage 2 (i.e., to which position the stage 2 has moved) is provided. The stage position monitor 44 informs the controller 17 of a monitored position.

On a surface of the substrate 5 placed on the stage 2, a thin film 6 (e.g. metal thin film, semiconductor film, insulation film) for forming a circuit of a semiconductor device is formed. Further, on a surface of the thin film 6, an electron ray resist 7 is applied.

For example, the electron ray resist 7 can be a positive resist or a negative resist. As the positive resist, a macro molecule whose principal chain is quaternary carbon is preferable, on the ground that a ratio of the principal chain broken by an electron ray (in actinochemistry, G-value standing for the number of reactions for every 100 eV is used) is large. Examples of the macro molecule of the positive resist are: halogenated poly acrylate such as poly methyl methacrylate (PMMA), poly hexafluoro butyl methacrylate (FBM), poly (trifluoro-α-chloroacrylate) (EBR-9), or the like; and a copolymer of methyl acrylate. Other examples of macro molecule of the positive resist are: poly butene-1-sulfone which is highly sensitive (1 $\mu C/cm^2$); and DNQ-novolac resin. For example, the DNQ-novolac resin is made of novolac resin and poly methyl pentene sulfone (PMPS). Alternatively, the positive resin may be a chemically amplified resist which utilizes an acid catalyst deprotection reaction.

The negative resist may be: poly (glycidyl methacrylate) (PGMA); a copolymer (COP) of glycidyl methacrylate and ethyl acrylate; or a resist of polystyrene, each containing an epoxy group, which utilizes its characteristic that its macromolecule exhibits a high sensitivity in a cross-linking reaction with an electron ray. The resist of polystyrene is a copolymer of a monomer containing an epoxy group and a monomer containing an aromatic ring. To improve the sensitivity, each resist may contain, in its chemical structure, at least one of halogen, chlormethyl group, and allyl group.

Nearby the top portion of the vacuum chamber 1, a projector (light pattern generating section) 8 for generating a two-dimensional light pattern 13 corresponding to a circuit pattern of the semiconductor device is provided so as to emit the light pattern 13 from a light-emission surface of the projector 8.

Examples of the projector 8 are: a projector adopting a transmissive liquid crystal method; and a projector adopting a single plate DLP (Digital Light Processing) method. A slight amount of photons existing in the dark portion of the light pattern 13 is multiplied by 1000 or more by a later-mentioned MCP 11, and is eventually project on a targeted portion of the electron ray resist 7 which is subject to the irradiation. Therefore, the projector is preferably the one adopting a single plate DLP method whose contrast ratio is generally high.

In case where an electron ray resist 7 is a resist material having a sufficient photosensitivity, and the contrast ratio of the projector 8 becomes a problem, a mask to block light may be arranged on a top surface (light entering surface) of the MCP 11 instead of using the projector 8. That is, by setting a photomask (including a liquid crystal shutter or the like) on a back surface of the MCP 11 (a light pattern 13 entering side), and by projecting light on the entire back surface of the MCP 11, it is not necessary to use the projector 8. In this case, however, it is necessary to set a photomask for every light pattern 13. The photomask does not require a high resolution, because a patterned amplified electron beam array 14 is eventually converged through a later-mentioned electron beam lens section 12.

Further, the projector 8 and the later-mentioned lens 9 can be replaced with an organic electroluminescence light emission section (hereinafter, EL light emission section) on which organic electroluminescence devices are arranged in a matrix manner. In this case, the following is also possible. The EL light emission is integrated with a later-mentioned photoelectric film 10. From the EL light emission, a light pattern 13 is directly projected to the photoelectric film without changing the size, so that a patterned electron beam array corresponding to the light pattern is projected from the photoelectric film 10 into the later-mentioned MCP 11. In either cases, the accuracy of the light pattern only needs to be a micrometer level at the later-mentioned stage where the photoelectric film 10 is projected; i.e., at a position where the photoelectric film enters the later-mentioned MCP 11.

On the light path of the light pattern 13, the microchannel plate (hereinafter, MCP (electronic amplification section)) 11 is provided. The MCP 11 generates a patterned electron beam array from the light pattern 13 having entered, amplifies the electron beam array to several thousands to several tens of thousand times, and then emits the amplified patterned electron beam array 14. This MCP 11 is provided so that the light path of the amplified electron beam array 14 extends substantially along the light path of the light pattern 13.

On the light path between the projector 8 and the MCP 11, it is possible to provide as needed a convex or a concave lens 9 for allowing the light pattern 13 to efficiently enter the MCP 11. Further, on the light-entering side of the MCP 11, it is preferable to provide a photoelectric film 10 for converting the entered light into electrons, and emitting the electrons.

Representative examples of a material for the photoelectric film 10 are: a multi alkali material (e.g. Na—K—Sb—Cs), a bi-alkali material (e.g. Sb—Rb—Ce, Sb—K—Cs), Ce—Te, Ag—O—Cs, GaAs, GaAsP or the like. CdS is widely used in the visible region. To increase the sensitivity, Cu, Ag, Sb or the like is added in general. The present embodiment deals with a case where CdS is adopted.

Note that the photoelectric film 10 can be omitted if photons of the light pattern 13 have energy which is larger comparing to the work function of the semiconductor section on the inner surface of the microchannel of the MCP 11. Further, the photoelectric film 10 is not needed either, in cases where a light pattern 13 of a short-wavelength UV ray of 200 nm or shorter is projected on the inside of the MCP 11. This is because secondary electrons are generated in the semiconductor section on the inner surface, and the amplified beam array 14 corresponding to the light pattern 13 can be obtained. The light pattern 13 of a UV is produced by providing a UV photo mask on a top surface (on the light-entering side) of the MCP 11.

Figure 2:
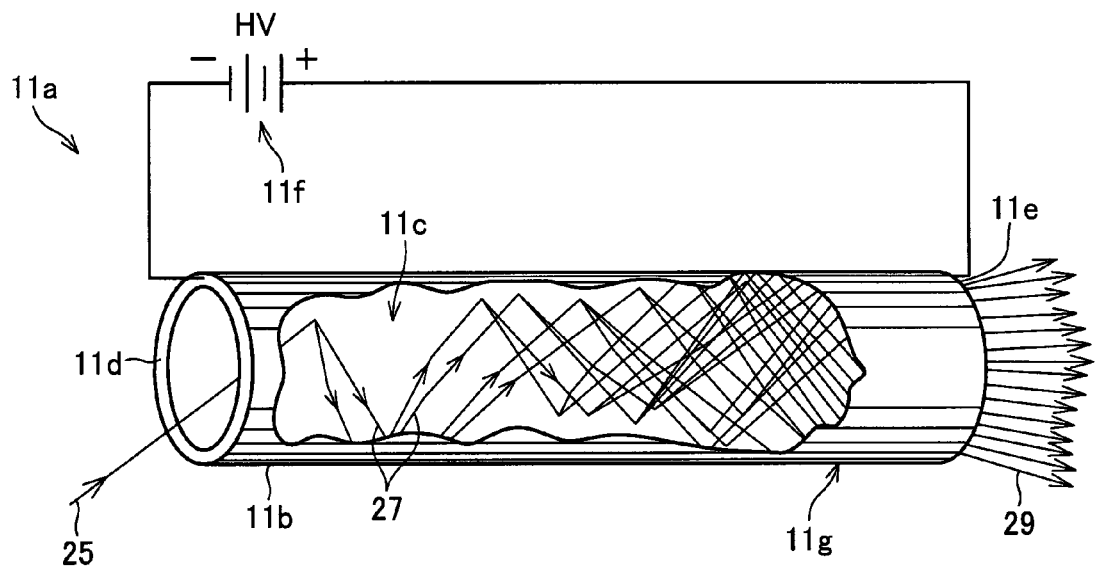
FIG. 2 is a perspective diagram showing a main-part-cutaway view of a microchannel of an MCP adopted in the electron beam irradiation device.
Figure 3:
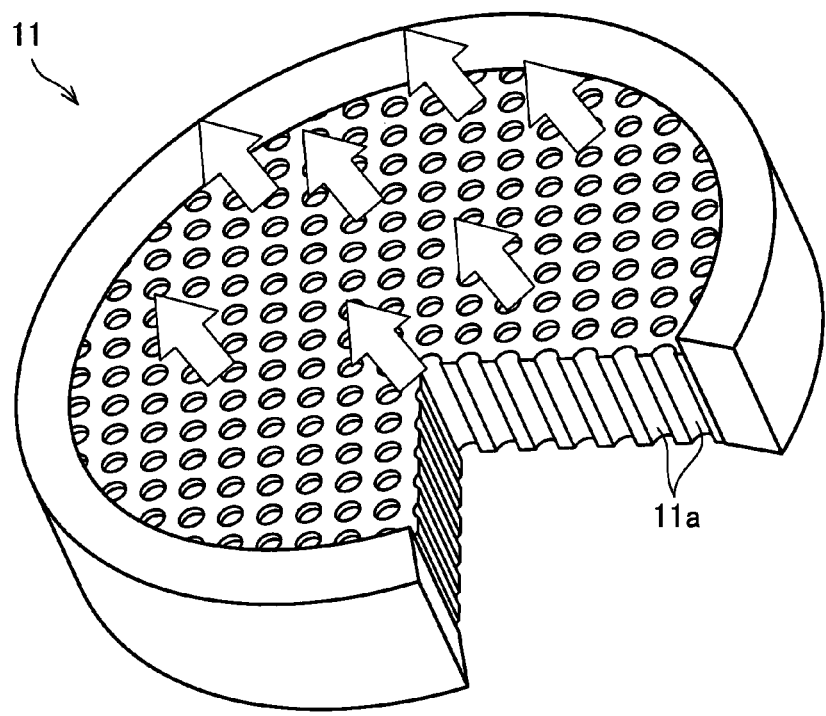
FIG. 3 is a perspective diagram showing a main-part-cutaway view of the MCP.

Next, the following describes the MCP 11. As shown in FIG. 2 and FIG. 3, the MCP 11 includes multiple cylindrical microchannels 11a. The microchannels 11a are formed so that: (i) they are adjacent and in parallel to one another (in a direction which perpendicularly crosses a light axis of the light pattern 13); and (ii) each of the microchannels 11a is extended in the direction of the light axis. The cylindrical shape of the microchannels 11a may be: a circular-cylindrical shape; a rectangular-cylindrical shape; or a hexagonal-cylindrical shape. However, in the present embodiment, a circular-cylindrical shape is adopted.

The following explanation regarding manufacturing of the MCP 11 deals with a single microchannel 11a of the MCP 1. First, in a main body 11b made of a lead glass plate for example, multiple cylindrical sections each extended in the thickness direction of the main body 11b are formed in parallel to one another. Each cylindrical section is 1 μm to 100 μm in diameter. A ratio (L/d) of the diameter versus the length of the cylindrical section is 20 to 2000, and is preferably 40 to 100. In the present embodiment, the diameter is set at 2μ to 10 μm, and the ratio (L/d) is set between 40 to 80. Further, the axis of the cylindrical section may be parallel to the normal direction of a surface of the lead glass, or tilted by approximately 8° with respect to the normal direction. In the present embodiment, the axis of the cylindrical section is parallel to the normal direction.

On the inner surface of each cylindrical section, a semiconductor section 11c is formed. The semiconductor section 11c is such that, when a single electron hits, secondary electrons are emitted multiple. The semiconductor section 11c is formed as a resistive semiconductor section on a surface of the main body 11b, by subjecting the main body 11b to a reduction process under a hydrogen atmosphere, at a high temperature of 250° C. to 450° C. The resistance of the semiconductor section 11c in the thickness direction of the main body 11b is set within a range from $10^8 \Omega$ to $10^{10} \Omega$.

The semiconductor section 11c may be a diamond-like carbon film deposited by means of plasma CVD (Plasma Chemical Vapor Deposition).

Figure 4:
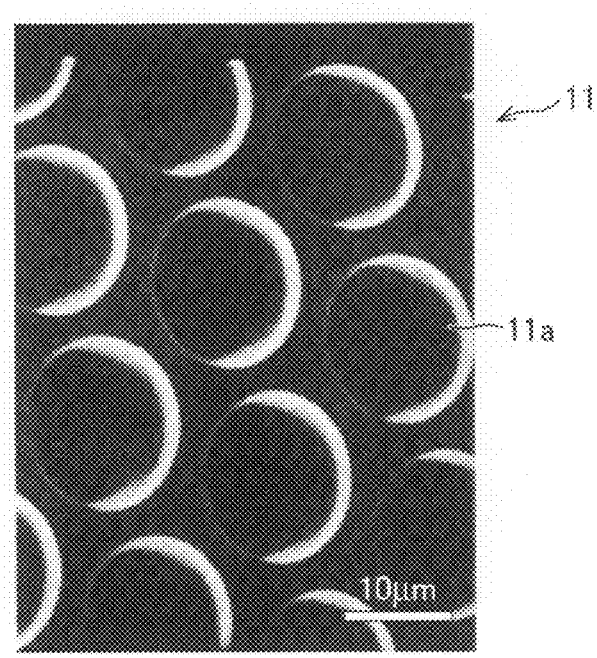
FIG. 4 is a plane view showing a main part of the MCP.

Subsequently, electrodes 11d and 11e are respectively formed on both sides of the main body 11 made of the lead-glass plate, the main body 11 having the cylindrical semiconductor sections 11c are formed in the thickness direction. The electrodes 11d and 11e are formed through vapor deposition of Nichrome or Inconel. Thus, microchannels 11a as shown in FIG. 4 are manufactured.

Figure 5:
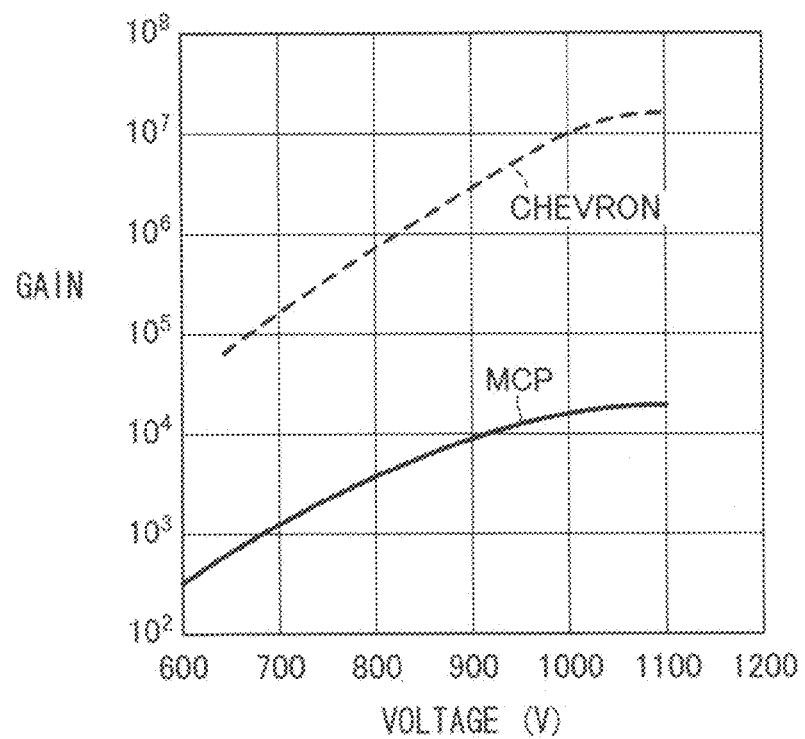
FIG. 5 is a graph showing a relationship between an voltage applied to the MCP and a gain.

Here, the electron-entering side of each of the microchannels 11a is negative, and the electron-emitting side of the same is positive. When a direct voltage of 600 to 1100V is applied between the electrodes 11d and 11e of the microchannel 11a, a single electron 25 enters from the side of the electrodes 11d on the electron-entering side. Then, the single electron 25 hits the semiconductor section 11c in the microchannel 11a, and multiple secondary electrons 27 are emitted in the hitting direction. The emitted electrons 27 hit the semiconductor section 11c, and emits more electrons. This process is repeated, and from a single electron, $5 \times 10^2$ to $3 \times 10^5$ electrons 25 are emitted in the form of electron beam 29. The curve "CHEVRON" in FIG. 5 shows a case where the MCP 11 includes two stages in series.

The electrons in the electron beam 29 from each microchannel 11a are intermittently emitted due to the charge/discharge characteristic of the MCP 11. Therefore, respective electrons of the adjacent electron beams 29 hardly becomes adjacent to each other. In other words, the electrons of the beams 29 hardly come close to each other by a distance between the respective central axes of the electron beams 29. Thus, repulsion between the electron beams 29 is weak.

Thus, the foregoing amplified electron beam array 14 is a collection of the multiple electron beams respectively from the microchannels 11a. The electron beams are apart from one another, and are emitted in the direction of the light path of the light pattern 13 (i.e., the lengthwise direction of the microchannels 11a). However, the multiple micro electron beams do not necessarily have to be in parallel to the lengthwise direction or the direction of the light path, and the beams may be slanted, as long as they are converged on the surface of the electron ray resist.

Here, it is possible to replace the photoelectric film 10 and the MCP 11 with HARP (High-gain Avalanche Rushing amorphous Photoconductor) film, in which case the HARP is used as an avalanche type photoconductor film. HARP film is a film of an amorphous selenium to which a high voltage is applied. When light is incident on the surface of the HARP film, photoelectric conversion occurs in the HARP film, and avalanche amplification of charge occurs in the same. Thus, electrons are emitted. Accordingly, when the light pattern 13 is incident on one surface of the HARP film, a patterned amplified electron beam array 14 is emitted from a surface on another side of the HARP film.

Figure 6:
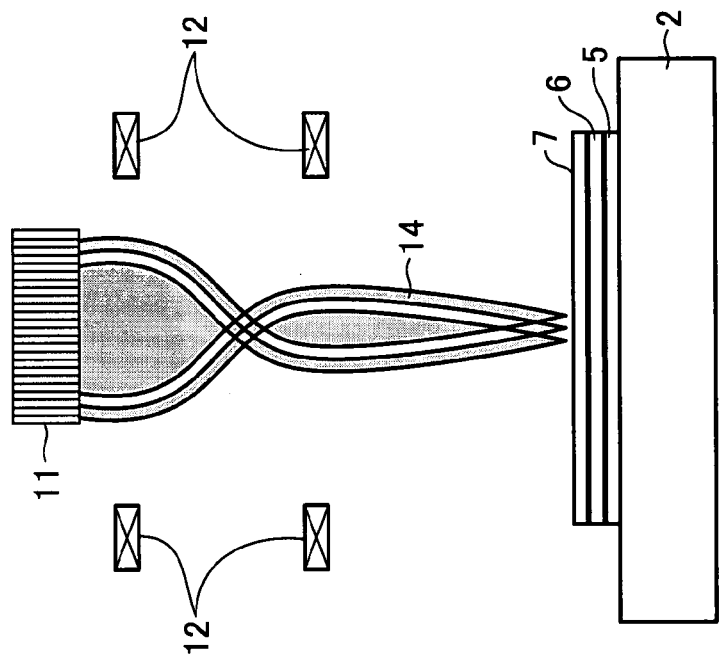
FIG. 6(a) is a perspective view showing an electron beam lens section in the electron beam irradiation device.
FIG. 6(b) is a front view showing the electron beam lens section in the electron beam irradiation device.
Figure 6:
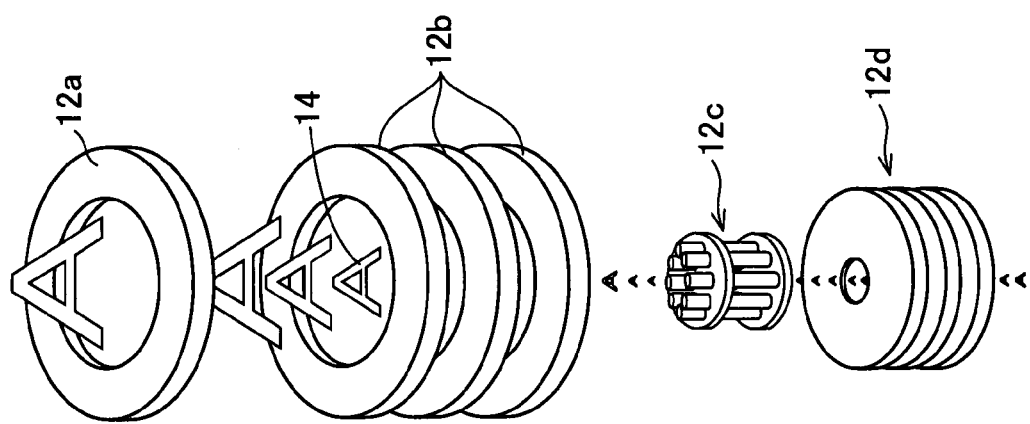
Figure 7:
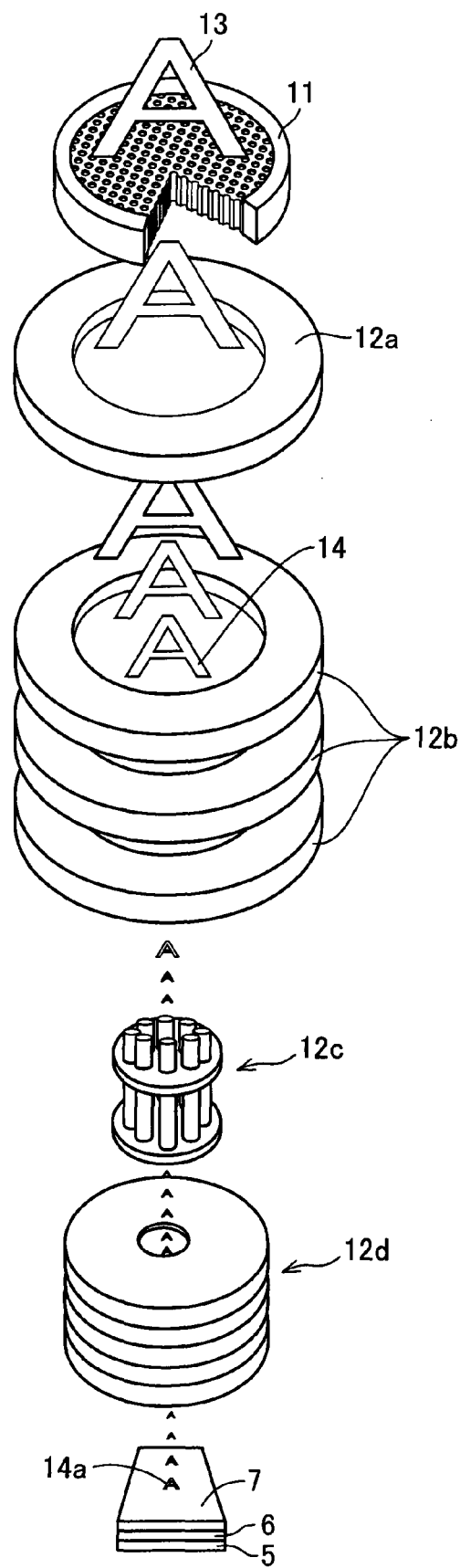
FIG. 7 is a perspective diagram showing a situation where an amplified electron beam array is generated from a light pattern, converged, and projected through the MCP and an electron lenses beam section.
Figure 8:
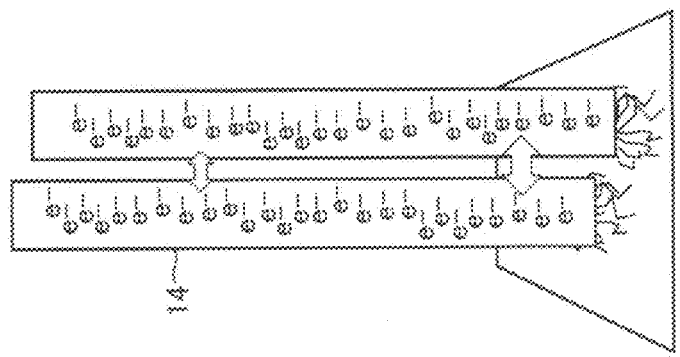
FIG. 8(a) is a perspective view showing a situation where the amplified electron beam array is converged.
FIG. 8(b) is a perspective view showing a situation where the amplified electron beam array is converged on the electron resist array.
FIG. 8(c) is a front view schematically showing an interaction between electron beams in the amplified electron beam array converged.
Figure 8:
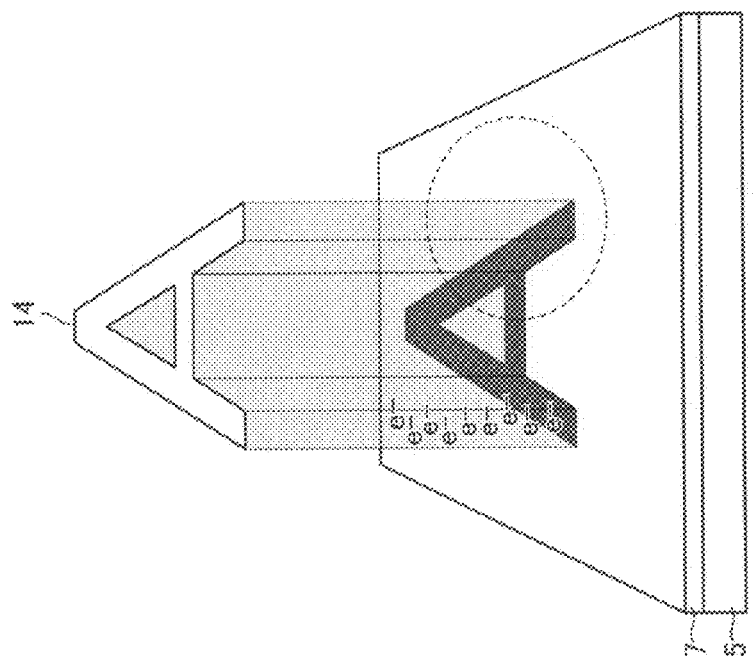
Figure 8:
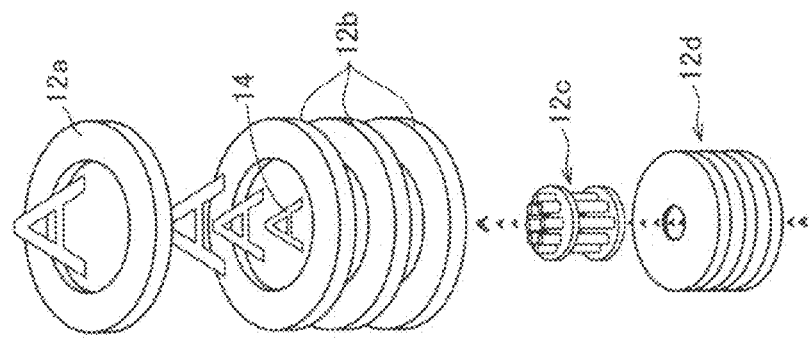
Figure 9:
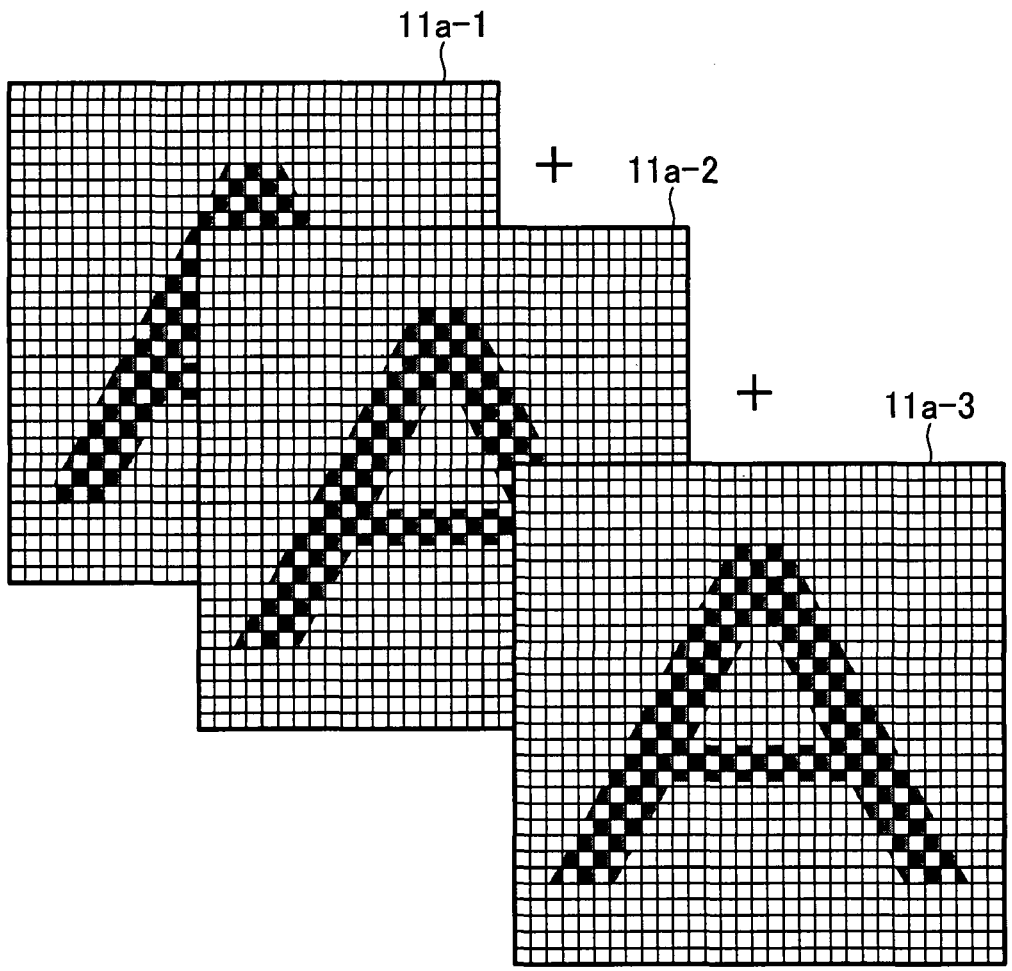
FIG. 9(a) is a front view showing an example of easing the interaction between the electron beams in the amplified electron beam array, and is showing divided light patterns which compensate one another, and which are formed by dividing the light pattern from which the amplified electron beam array is generated.
FIG. 9(b) is a front view showing the amplified beam array obtained when combining the divided light patterns.
Figure 9:
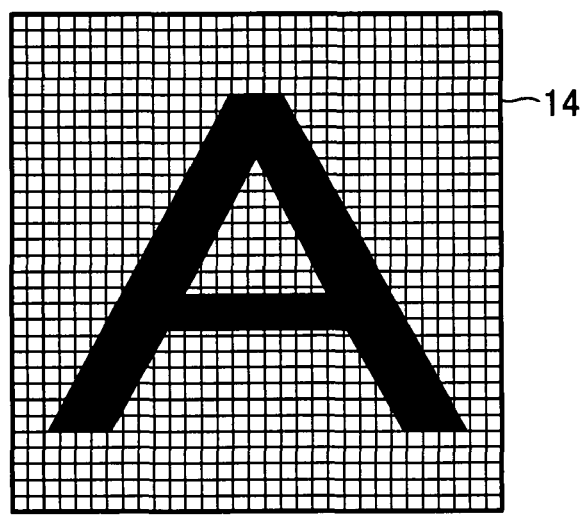
Figure 10:
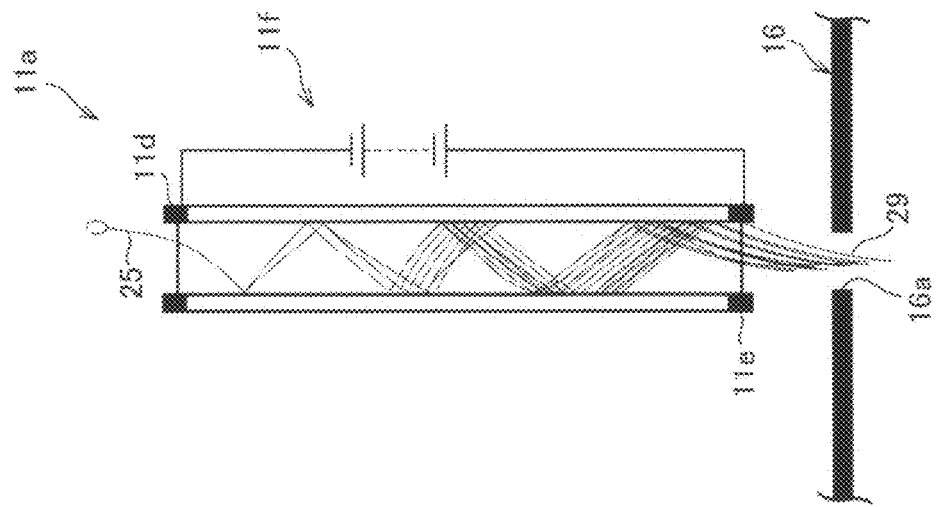
FIG. 10(a) is a perspective view showing a main-part-cutaway view of a grid electrostatic lens section for reshaping the amplified electron beam array from the MCP.
FIG. 10(b) is a cross sectional view of the grid electrostatic lens section.
Figure 10:
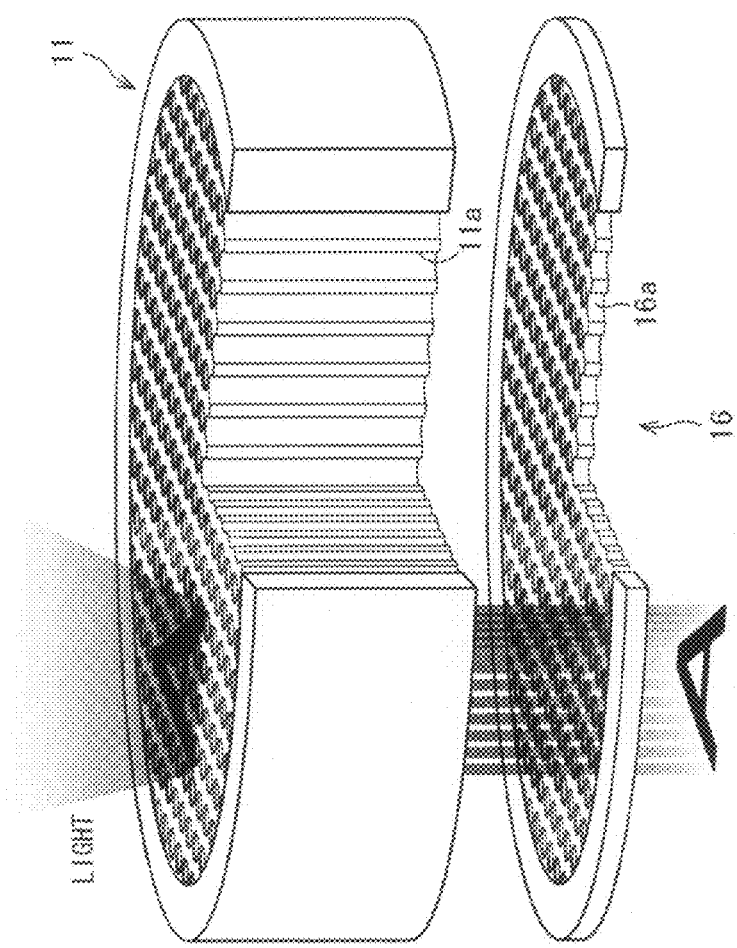
Figure 13:
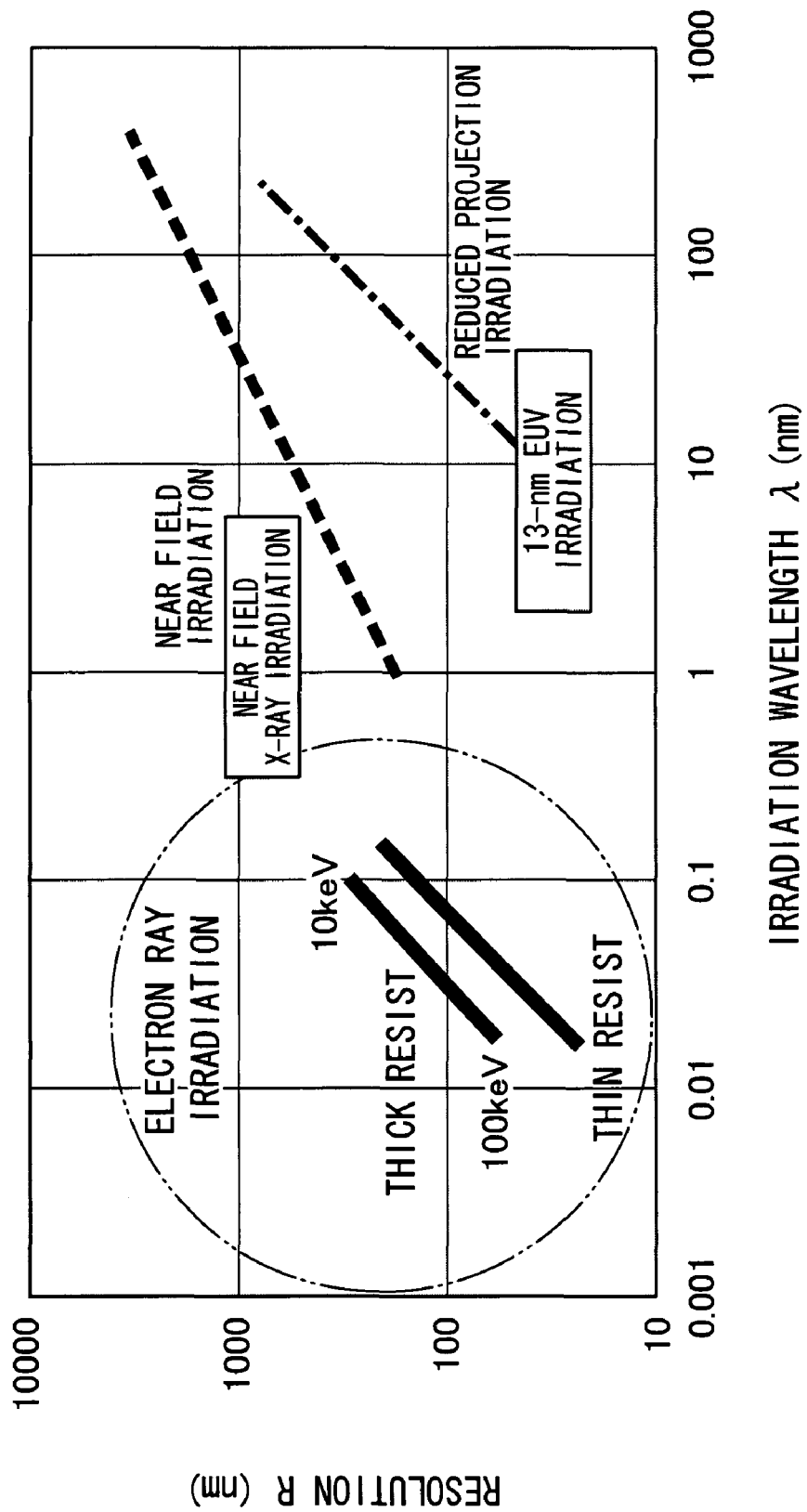
FIG. 13 is a graph showing a relationship of a resolution to irradiation wavelengths in X-ray irradiation, EUV irradiation, and electron ray irradiation.
Figure 14:
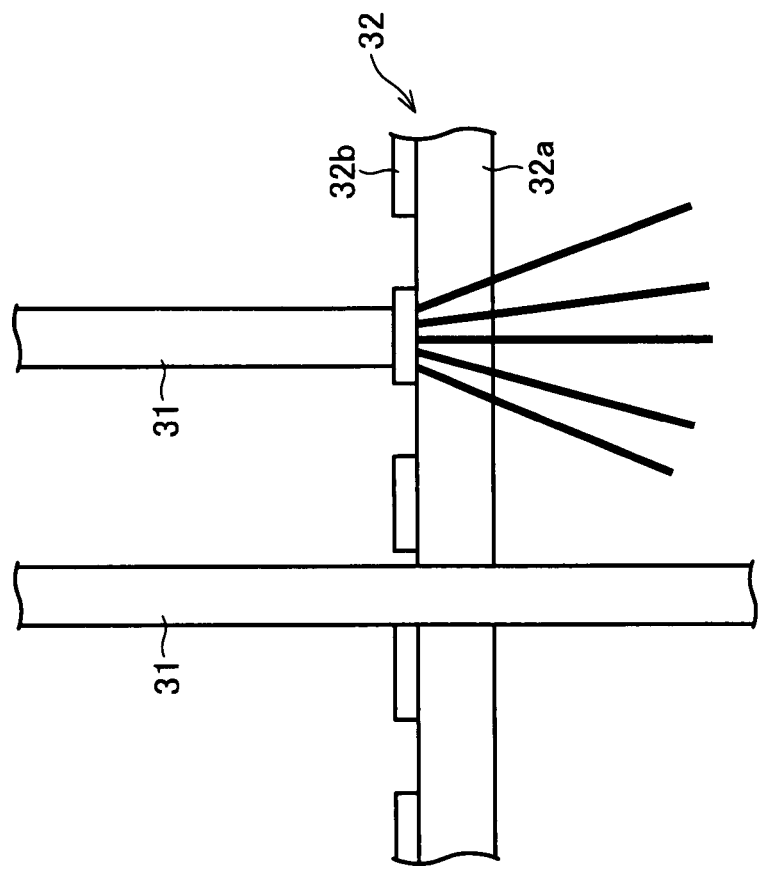
FIG. 14(a) is a cross-sectional view showing an exemplary irradiation process by means of a conventional electron beam.
FIG. 14(b) is an enlarged cross-sectional view showing a main part of the exemplary irradiation shown in FIG. 14(a) using the conventional electron beam.
Figure 14:
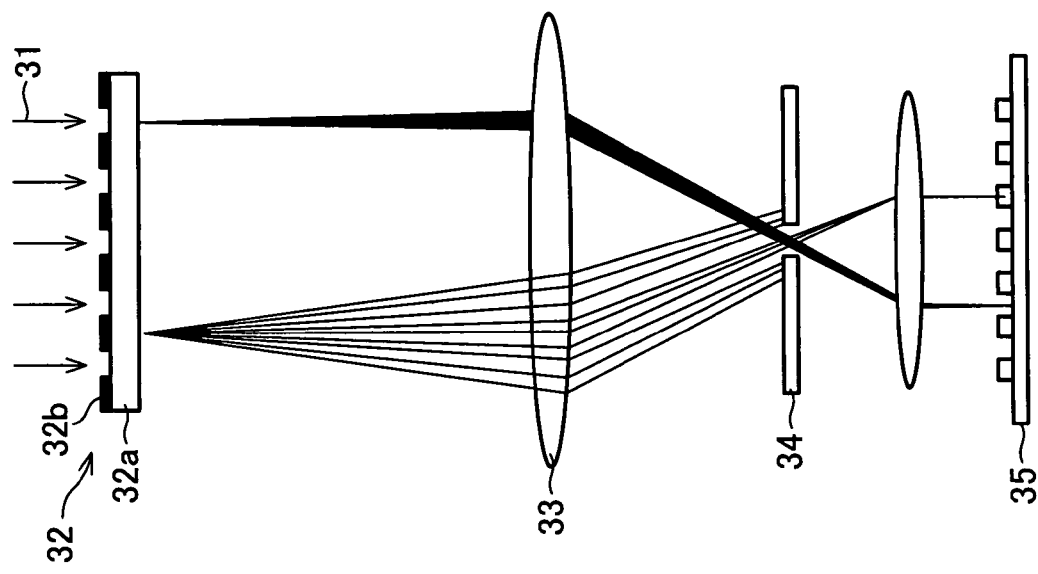

Further, in the present embodiment, the combination of the light pattern generating section 8, photoelectric film 10, and MCP 11 can be replaced with another device. The other device can be any device provided that the device is capable of generating a patterned amplified electron beam array 14 through a voltage control, and that a resist is exposed to the electron beam array 14. Such a device may be any one of the following electron emitting source: a surface-conduction electron-emitter (SED); a micro-dip array having a sharp end portion made of silicon or molybdenum, carbon nanotube array; and a field emission display (FED) such as a diamond thin film or the like As shown in FIG. 1, FIG. 6, and FIG. 7, the vacuum chamber 1 includes an electron beam lens section 12 for accelerating, converging, aligning, and projecting the amplified electron beam array 14 emitted from the MCP 11, along the light path of the patterned amplified electron beam array 14.

The electron beam lens section 12 includes: an accelerating tube section 12a; a converging lens section 12b; a multipole polarization electrode section 12c for alignment; and a projection lens section 12d, each section being arranged along a direction in which the amplified electron beam array 14 travels. The electron beam lens section 12 at least includes the converging lens section 12b. However, the electron beam lens section 12 may further include as needed at least one of accelerating tube sections 12a, a multipole polarization electrode section 12c for alignment, and a projection lens section 12d.

The accelerating tube section 12a is for accelerating the amplified electron beam array 14, shortening the wavelength of each electron ray, and improving the lithography resolution on the electron ray resist 7. The converging lens section 12b is for converging the patterned amplified electron beam array 14 in the in-plane direction which perpendicularly crosses the light path of the array 14. The multipole polarization electrode section 12c is for compensating distortion in the amplified electron beam array 14 having passed the converging lens section 12b. The projection lens section 12d is for projecting, on the electron ray resist 7, a desirably sized amplified electron beam array 14 having passed the multipole polarization electrode section 12c, thereby forming the lithography pattern 14a corresponding to the amplified electron beam array 14.

With the accelerating tube section 12a such as an acceleration lens or an acceleration electrode, the wavelength of each electron ray in the amplified electron beam array 14 is shortened to approximately 0.01 nm, at 100 keV. Therefore, with the amplified electron beam array 14 whose wavelengths are shortened, it is possible to form finer lithography pattern 14a of 5 nm scale or smaller on the electron ray resist 7 exposed. After that, a highly integrated semiconductor device having a fine pattern is formed through an ordinary semiconductor manufacturing process.

As shown in FIG. 1, a controller (compensating section) 17 is provided in a computer. The controller 17 is for generating a two-dimensional light pattern 13 in the projector 8, controlling an electron beam lens section 12, and controlling mechanical drive 3 for moving and driving the stage 2. To this controller 17, connected are (i) a display 18 serving as a display output section and (ii) an input section 19 such as a keyboard or a mouse.

Then, the controller 17 is set so as to also serve as a compensation section for compensating the light pattern 13. That way, distortion in the lithography pattern 14a formed by accelerating, converging, aligning and projecting the amplified electron beam array 14 is reduced.

A first exemplary compensation could be compensation of distortion in the electron beam lens section 12. An electric field generated by the electron beam lens section 12 spatially exhibits its intensity distribution. Therefore, the rate of reduction nearby the center of the patterned amplified electron beam array 14 converged differs from that nearby the periphery of the array 14. In order to solve this problem, the controller 17 controls the projector 8 so as to generate an entering light pattern (reverse distortion light pattern) which is a product of inverse function of distortion which occurs in the electron beam lens section 12 in relation to a desirable pattern. As such, the controller 17 includes a reverse distortion light pattern generating section.

Accordingly, in the first example, distortion of the lithography pattern 14a formed by the amplified electron beam array 14, which distortion occurs in the electron beam lens section 12 is canceled by the entering light pattern. Further, it is possible to obtain, on the electron ray resist 7, a lithography pattern 14a formed by converging and projecting the two-dimensional amplified electron beam array 14, which pattern corresponds to a desirable circuit pattern, with an ordinary resolution of electron beams.

As a result, in the first example, the lithography pattern 14a which is an irradiated pattern formed by the amplified electron beam array 14 can be formed highly accurately and programmably, by performing the compensation from the side of the light pattern 13. Therefore, for example, it is possible to perform finer processing with the more miniaturized feature size of 5 nm or smaller, and a LSI having a semiconductor device of an about 5 nm scale or smaller can be manufactured programmably at a low cost.

Next, a second exemplary compensation is described below. The second exemplary compensation is for avoiding lowering of the resolution which occurs as follows. As the amplified electron beam array 14 is converged on the electron ray resist 7 through the electron beam lens section 12 and approaches the electron ray resist 7 (see FIG. 8(a) and FIG. 8(b)), a force of interaction between adjacent micro electron beams 14b increases as shown in FIG. 8(c). The force of interaction causes scattering of the beams, consequently deteriorating the resolution.

In view of the problem, as shown in FIG. 9(a), the projector 8 is controlled by the controller 17 so as to generate in a time-sharing manner, multiple divided light patterns 11a-1 to 11a-3, which compensate one another, from the light pattern 13 entering the microchannels 11a arranged in a matrix manner in the MCP 11. Since each of the divided light patterns 11a-1 to 11a-3 are formed so as to compensate one another, overlapping of all the patterns will restore the light pattern 13 as shown in FIG. 9(b). Thus, the controller 17 includes a section generating divided light pattern.

As described, in the second exemplary compensation, the micro electron beams 14b in each of the divided light patterns 11a-1 to 11a-3 to be projected on the electron ray resistor 7 are apart from one another. Therefore, the problem caused by the force of interaction is further restrained. Thus, the second exemplary compensation also prevents lowering of the resolution, and thereby allows highly accurate and programmable manufacturing of a super high-density LSI, at a low cost.

Here, Embodiment 1 deals with a case of three divided light patterns 11a-1 to 11a-3; however, it is possible that the number of divided light patterns is 100 for example. Since each divided light pattern is controlled by light, it is possible to successively project the 100 divided light patterns in milli second order.

Further, in the electron beam irradiation device or the semiconductor manufacturing device of the present invention, a grid electrostatic lens section 16 can be provided on the emission side of the MCP 11 as shown in FIG. 10(a) and FIG. 10(b), to prevent lowering of the resolution caused by uneven emission angle of the amplified electron beam array 14 from the MCP 11.

The grid electrostatic lens section 16 has hollow sections 16a which are aligned in a grid manner so as to respectively correspond to microchannels 11a of the MCP 11. Each of the hollow sections 16a is formed so that a space is formed in the direction in which an amplified electron beam from the associated one of microchannels 11a travels. When a voltage is applied to the grid electrostatic lens section 16, a force that attracts the amplified electron beam array 14 from the MCP 11 is generated. By letting the amplified electron beam array 14 having been accelerated pass the hollow sections 16a arranged in the grid manner, the beams in the array 14 are made parallel to each other, and the divergence of the emission angle is restrained. Therefore, lowering of the resolution attributed to the divergence is restrained, and the lithography pattern 14a is mad more similar to the light pattern 13. Thus, a highly accurate lithography pattern 14a is obtained.

As described, when: (I) using the MCP 11 having microchannels 11a each of which is 10 μm in diameter, and which are arranged so that a distance from the center of one microchannel 11a to that of an adjacent microchannel 11a is 12 μm; and (II) supposing that a total irradiation current is 20 mA when a rated electron voltage of 2 keV is applied to each of electrodes 11d and 11e of the MCP 11, a micro electron beam 14b of 0.5 μA is obtained from each microchannel 11a of the MCP 11, and the speed of irradiation is 40000 times faster than a lithography process using a conventional electron beam 14c obtained by using the same irradiation current (See FIG. 11(a)).

This value of speed of irradiation corresponds to the number of microchannels 11a formed in the MCP 11. As such, it is believed that increasing the number of the microchannel 11a in the MCP will further accelerate the irradiation speed (lithography speed) proportionally.

Further, from a calculation supposing that a total amount of overall electrons used in exposing the electron ray resist 7 and the wavelength are the same as the conventional case, it is believed that the resolution of lithography improves 40000 times better than that using a conventional electron beam. This is based on the supposition that the resolution (i.e., diffusion of electron beams) is proportional to the primary current. From the above result, it is apparent that the electron beam irradiation device and the semiconductor manufacturing device of the present invention have high potentials.

Further, since the present invention adopts an electron beam which allows fine irradiation and processing beyond the limit of the wavelength of light, the present invention allows irradiation of resist and direct fine processing in a manufacturing process of a semiconductor device or a micro machine.

Furthermore, in the present invention, a two dimensional pattern formed by electron beams is projected at once. Therefore, reticle is no longer needed, and high-speed and programmable irradiation and processing are possible. Since the wavelength of the electron beam is dependent on a acceleration voltage, accelerating an electron ray by applying a high voltage allows a fine processing according to the accelerated speed. The present invention provides drastic solutions to conventional problems which caused difficulties in practical application, and largely advances LSI manufacturing technologies.

For example, conventionally, in manufacturing of 1G DRAM adopting rules of 180 nm to 150 nm scale, an excimer laser (wavelength: 193 nm) is used. Through the two-dimensional collective (one-time) irradiation of the present invention, fine processing at an irradiation wavelength of $\frac{1}{10,000}$ or shorter is possible (10T DRAM is possible), ideally. Therefore, a significant improvement of LSI performance is expected, even after considering the diffusion of electron.

Embodiment 2

Figure 16:
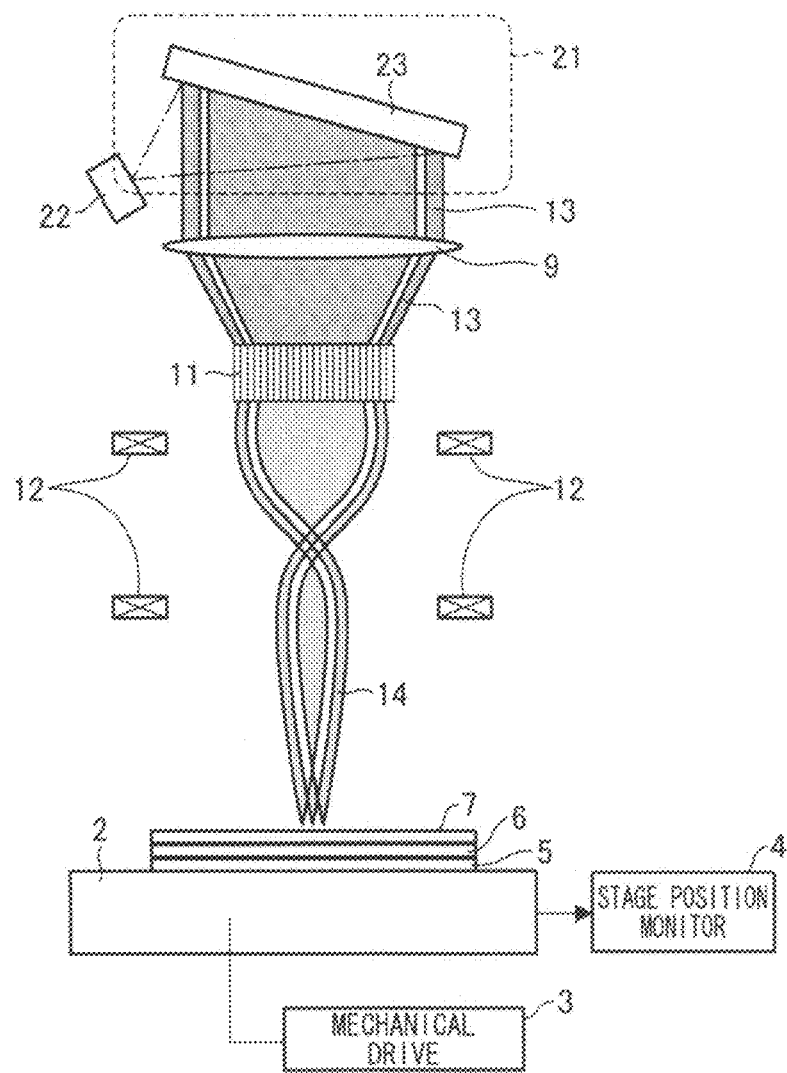
FIG. 16 is a cross sectional view schematically showing a main part of an electron beam irradiation device of Embodiment 2, in accordance with the present invention.
Figure 17:
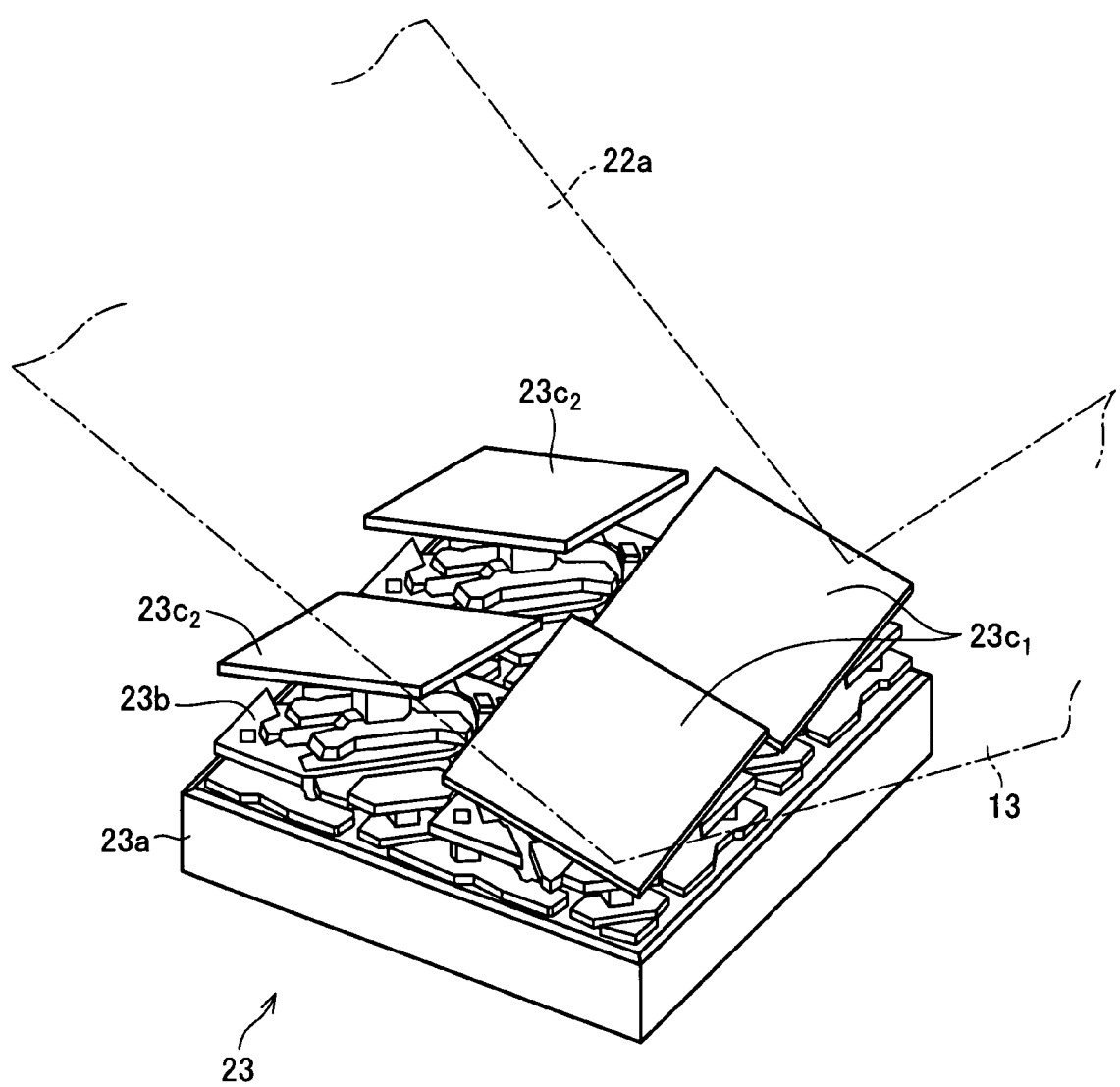
FIG. 17 is a perspective diagram showing a main part of DMD (Digital Mirror Device®, micro-mirror array section) in the electron beam irradiation device of Embodiment 2.

The following describes an electron beam irradiation device of Embodiment 2 according to the present invention, with reference to FIG. 16 and FIG. 17. In Embodiment 2, the members having the same functions as those described in Embodiment 1 are given the same symbols, and explanation therefor are omitted here.

First, Embodiment 1 deals with a case of adopting a photoelectric film 10. Since the photoelectric film 10 cannot be exposed to the air, it is necessary to maintain the vacuum state. Due to such a photoelectric film 10, the entire device such as the vacuum chamber 1 and vacuum pump is enlarged.

In view of the problem, in the present embodiment, the projector 8 is replaced with a different light pattern generating section 21 so as to eliminate the photoelectric film 10 (See FIG. 16). The light pattern generating section 21 includes a femto-second laser 22, and a micro-mirror array section 23 for reflecting thereon a laser beam from the femto-second laser 22 in a form of two dimensional light pattern.

An example of the femto-second laser 22 is a femto-second laser whose cyclic frequency is 50 MHz, pulse width is 90 fsec (femto second) to 180 fsec, wavelength is in the visible region (e.g. 780 nm). Specifically, for example, a titanium-sapphire laser or a Yb:YAG laser can be used. Further, the average output of the femto-second laser 22 is, for example, 10 mW to 60 mW.

As shown in FIG. 17, the micro-mirror array section 23 includes: a substrate 23$a$; multiple drive sections 23$b$; and micro mirrors 23$c$ respectively driven by the drive sections. An example of the micro-mirror array section 23 is Digital Mirror Device®.

Each of the micro mirrors 23$c$ is a mirror formed in the form of a square plate, which mirror reflects visible light. The micro mirrors 23$c$ are arranged in a matrix manner. The number of micro mirrors ranges from 480 thousand to 1.31 million. Here, "arranged in a matrix manner" means that the micro mirrors 23 are aligned in a checker-board manner. That is, the micro mirrors are aligned in a raw direction and a column direction which cross each other (preferably cross each other perpendicularly), so as to form a two-dimensional light pattern 13. In Embodiment 2, the micro-mirror array section 23 adopted includes micro mirrors 23$c$ which are divided into 16×64 blocks corresponding to 64×16 of data transmission unit blocks.

Further, the drive sections 23$b$ are provided for the micro mirrors 23$c$ on a one-by-one basis. For example, each micro mirror 23$c$ is able to rotate by approximately ±12 degrees, about its rotation axis which is the central axis extended in the raw direction. Further, the drive section 23$b$ is capable of repetitively rotating the associated micro mirror 23$c$ several thousand times in a single second.

The control of the drive sections 23 is similar to image displaying control in a liquid crystal panel, and is as described below.

First, two-dimensional pattern data for the light pattern 13 is latched (to retain data to synchronize the data) by a shift register. Then, data loading is performed for each of the blocks of the micro mirrors 23$c$ forming a matrix.

Subsequently, information of 0 or 1 (i.e., information of plus 12 deg. or negative 12 deg. for example) is transmitted to a row element designated by a row decoder for each micro mirror 23$c$.

Based on the information, each drive section 23$b$ slants the micro mirror 23$c$ as in the case of micro mirror 23$c_1$ or 23$c_2$.

Then, the laser beam 22$a$ from the femto-second laser 22 is projected on each of the micro mirrors 22$c$. Then, light having reflected on the micro mirror 23$c$ is projected on the microchannel 11$a$ of the MCP 11, in the form of the light pattern 13.

In the semiconductor section 11$c$ on the inner surface of each microchannel 11$a$, the total energy of multiple photons in the light pattern 13 is larger than the energy of the work function of the semiconductor section 11$c$. As such, a multiphoton excitation state occurs, and electrons are mainly emitted in a direction corresponding to the direction in which the photons have entered. As mentioned above, secondary electrons are generated in the semiconductor section 11$c$ from the electrons emitted. Then, lithography is performed by converging the patterned amplified electron beam array 14 on the electron ray resist 7, as is already mentioned.

With Embodiment 2, it is possible to form a lithography pattern 14$a$ of 5 nm or less in line width on the electron ray resist 7 by performing a programmable irradiation using the amplified electron beam array 14. Further, it is possible to omit the photoelectric film 10 which requires maintenance of the vacuum state. Therefore, it is possible to downsize the electron beam irradiation device and vacuum pomp, and to lower the costs.

Further, in Embodiment 2, the micro-mirror array section 23 is used. Therefore, by individually controlling the micro mirrors 23$c$, it is possible to correct the light pattern 13 as is done in Embodiment 1.

Figure 18:
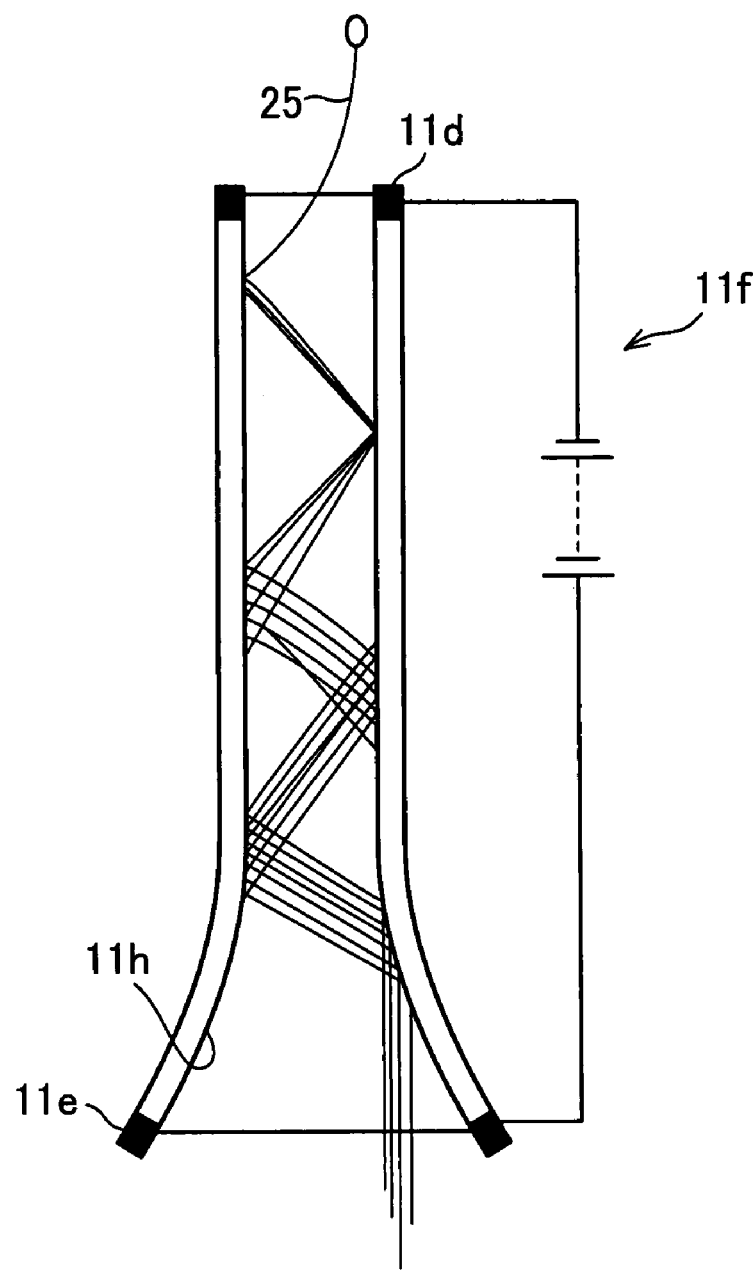
FIG. 18 is a cross sectional view showing an alternative form of a microchannel of an MCP in the electron beam irradiation device of Embodiments 1 and 2, in accordance with the present invention.

Note that both Embodiments 1 and 2 deal with a case where the shape of the inner surface of each microchannel 11$a$ is in a straight cylindrical shape with its inner diameter kept constant from the light-entering side to the light-emitting side. However, as shown in FIG. 18, it is possible to adopt an electron beam reshaping section 11$h$ whose end on the light-emitting side has an outwardly-spread shape. Here, by "outwardly-spread shape", it means that the inner diameter is gradually increased towards the end on the light-emitting side.

With the electron beam reshaping section 11$h$ having the outwardly-spread shape, the electron beam emitted from the microchannel 11$a$ can be collimated: i.e., the electron beam is directed to a direction corresponding to the direction of the central axis of the microchannel 11$a$.

Accordingly, even without the grid electrostatic lens section 16, the alternative form yields an effect similar to that obtained when the grid electrostatic lens section 16 is provided. This allows, while allowing downsizing, formation of highly fine lithography pattern.

Further, the electron beam irradiation device may be adapted so that the electron amplifying section is an avalanche photoconductor film.

In the electron beam irradiation device, the light pattern generating section may include a light source, and a mask pattern for generating the light pattern with the light from the light source. With the system adopting the mask pattern, the light pattern generating section is simplified, and the overall cost can be reduced. Further, if distortion in the lithography pattern is predictable to a certain degree, the distortion can be restrained by using a mask pattern corrected according to the predicted distortion. That way, the accuracy of the lithography pattern can be improved.

In order to solve the foregoing problems, a semiconductor device of the present invention includes: a vacuum chamber; any one of the above mentioned electron beam irradiation devices which is provided inside the vacuum chamber; an electron ray resist, provided inside the vacuum chamber, on a surface of which resist an amplified electron beam array is converged; and a stage for placing thereon a substrate having the electron ray resist on its surface, the irradiation device having a light pattern generating section for generating a two-dimensional light pattern according to a circuit pattern of a semiconductor device.

With the system having the electron beam irradiation device of the present invention, the light pattern generating section generates a two-dimensional light pattern according to a circuit pattern of a semiconductor device. Based on the light pattern, a patterned electron beam array is generated. By accelerating the electron beam array, it is possible to achieve the shortest possible wavelength of electron rays in the electron beam array. Accordingly, for example, it is possible to perform a fine processing with feature size of 5 nm or smaller. Therefore, it is possible to manufacture a LSI having a semiconductor device of about 5 nm scale or smaller.

The semiconductor manufacturing device preferably includes a substrate moving section for moving the substrate in a direction perpendicularly crossing a direction in which the amplified electron beam array to be converged on the substrate is projected.

In the system, there is provided the substrate moving section for moving the substrate (e.g. a wafer of 100 mm or 500 mm in diameter) in the direction perpendicularly crosses the amplified electron beam array projecting direction (e.g. a horizontal direction). Therefore, it is possible to form a lithography pattern according to a circuit pattern, by moving the substrate. Thus, it is possible to form a lithography pattern corresponding to a circuit pattern, even on a substrate having a large surface area.

Further, by performing compensation on the light pattern side by using a compensating section in the used irradiation device, distortion in the formed pattern is restrained. Thus, it is possible to manufacture a super-highly-integrated semiconductor device more accurately and promptly.

As mentioned above, the semiconductor manufacturing device of the present invention includes the electron beam irradiation device of the present invention, and the light pattern generating section generates a two-dimensional light pattern according to a circuit pattern of a semiconductor device.

Therefore, with the system, it is possible to highly accurately and programmably form a desirable circuit pattern at a high resolution, which pattern is formed by the amplified electron beam array. As a result, for example, it is possible to perform a fine processing with the minimum feature size of 5 nm or smaller, and manufacture a LSI having a semiconductor device of 5 nm scale or smaller.

INDUSTRIAL APPLICABILITY

An electron beam irradiation device of the present invention allows speeding up of a pattern irradiation using an electron beam capable of finer processing. Therefore, it is possible to manufacture at a low cost a semiconductor device whose performance is improved through a finer processing.

Since the electron beam irradiation device of the present invention is capable of simplifying and speeding up a manufacturing process of more highly accurate semiconductor device, the device is suitably applicable to a field of manufacturing semiconductors such as a lithography device and LSI, a field of communications devices such as mobile phones using LSIs, and a computer field in which semiconductor devices such as LSIs are used in many occasions.

The invention claimed is:

1. An electron beam irradiation device, comprising:
   a light pattern generating section for generating a two-dimensional light pattern;
   an electron amplification section for (i) generating an electron beam array based on the light pattern entered, (ii) amplifying the electron beam array, and (iii) emitting the electron beam array as an amplified electron beam array, wherein said electron amplification section includes multiple cylindrical microchannels which are arranged adjacent to one another in a direction perpendicularly crossing a direction of a light axis of the light pattern so that respective axes of the microchannels are parallel to the direction of the light axis;
   an electron beam lens section for converging the amplified electron beam array on an electron ray resist; and
   a controller for controlling the light pattern generating section so as to generate, in a time-sharing manner, multiple divided light patterns which compensate one another, from the light pattern entering the microchannels.

2. The electron beam irradiation device as set forth in claim 1, wherein:
   said electron beam lens section is performs at least one of (i) acceleration of the amplified electron beam array, (ii) alignment of the amplified electron beam array, and (iii) projection of the amplified electron beam array.

3. The electron beam irradiation device as set forth in claim 1, wherein:
   said electron amplification section includes a photoelectric film for (i) converting, into an electron, a photon entering from a light pattern entering side, and (ii) for emitting the electron.

4. The electron beam irradiation device as set forth in claim 1, wherein:
   said light pattern generating section includes: a femto-second laser; and a micro-mirror array section for reflecting thereon a laser beam from the femto-second laser, thereby forming the two-dimensional light pattern.

5. The electron beam irradiation device as set forth in claim 1, wherein:
   the controller includes a compensating section for compensating the light pattern so as to reduce distortion that occurs in a pattern formed by the said amplified electron beam array.

6. The electron beam irradiation device as set forth in claim 5, wherein:
   said compensating section includes a section generating reversely-distorted light pattern which controls the light pattern generating section to generate a reverse-distortion light pattern so as to cancel distortion that occurs in the amplified electron beam array.

7. The electron beam irradiation device as set forth in claim 1, further comprising:
   a grid electrostatic lens section provided on an emitting side of the electron amplification section, for restraining divergence in emission angle of the amplified electron beam array from the electron amplification section.

8. The electron beam irradiation device as set forth in claim 1, wherein each of the microchannels has a diameter not greater than 10 μm.

9. The electron beam irradiation device as set forth in claim 1, wherein each of the microchannels has a diameter between 2 μm and 10 μm.

10. An electron beam irradiation device, comprising:
a light pattern generating section for generating a two-dimensional light pattern;
an electron amplification section for (i) generating an electron beam array based on the light pattern entered, (ii) amplifying the electron beam array, and (iii) emitting the electron beam array as an amplified electron beam array; and
an electron beam lens section for converging the amplified electron beam array on an electron ray resist, wherein:
said electron amplification section includes multiple cylindrical microchannels which are arranged adjacent to one another in a direction perpendicularly crossing a direction of a light axis of the light pattern so that respective axes of the microchannels are parallel to the direction of the light axis, and
each of said microchannels has such a shape that its inner peripheral surface of an end portion, on an emission side of the amplified electron beam array, is gradually spread outwardly towards an emission end of the microchannel, for a purpose of restraining divergence in emission angle of the amplified electron beam array from the electron amplification section.

* * * * *